(12) United States Patent
Zhang et al.

(10) Patent No.: US 11,024,817 B2
(45) Date of Patent: Jun. 1, 2021

(54) DISPLAY PANEL AND A MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanqi Zhang, Beijing (CN); Ge Wang, Beijing (CN); Jianpeng Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/613,000

(22) PCT Filed: Mar. 7, 2019

(86) PCT No.: PCT/CN2019/077310
§ 371 (c)(1),
(2) Date: Nov. 12, 2019

(87) PCT Pub. No.: WO2019/228007
PCT Pub. Date: Dec. 5, 2019

(65) Prior Publication Data
US 2020/0335711 A1 Oct. 22, 2020

(30) Foreign Application Priority Data
May 31, 2018 (CN) .......................... 201810552167.7

(51) Int. Cl.
H01L 51/00 (2006.01)
H01L 27/32 (2006.01)
H01L 51/56 (2006.01)

(52) U.S. Cl.
CPC ...... *H01L 51/0097* (2013.01); *H01L 27/3244* (2013.01); *H01L 51/003* (2013.01);
(Continued)

(58) Field of Classification Search
None
See application file for complete search history.

(56) References Cited

U.S. PATENT DOCUMENTS

2014/0008657 A1* 1/2014 Lu ........................... H01L 33/48
257/59
2016/0315284 A1* 10/2016 Jeon .................... H01L 51/5256
(Continued)

FOREIGN PATENT DOCUMENTS

| CN | 106449665 A | 2/2007 |
|---|---|---|
| CN | 107195794 A | 9/2017 |

(Continued)

*Primary Examiner* — Joe E. Schoenholtz
(74) *Attorney, Agent, or Firm* — Muncy, Geissler, Olds & Lowe, P.C.

(57) ABSTRACT

The preset disclosure provide a display panel and a manufacturing method thereof and a display device. The display panel includes a display area and a peripheral area located in a periphery of the display area; wherein a stress absorption structure is provided in the peripheral area of the display panel.

17 Claims, 5 Drawing Sheets

(52) U.S. Cl.
CPC ........ *H01L 51/56* (2013.01); *H01L 2227/326* (2013.01); *H01L 2251/5338* (2013.01); *H01L 2251/566* (2013.01)

(56) References Cited

U.S. PATENT DOCUMENTS

| | | |
|---|---|---|
| 2018/0052493 A1 | 2/2018 | Hong et al. |
| 2018/0111869 A1 | 4/2018 | O'Connor et al. |
| 2019/0013338 A1 | 1/2019 | Cao et al. |
| 2019/0143631 A1* | 5/2019 | Zhang ................... B32B 3/266 428/138 |
| 2019/0157586 A1 | 5/2019 | Liu et al. |
| 2019/0181362 A1 | 6/2019 | Tian et al. |

FOREIGN PATENT DOCUMENTS

| | | |
|---|---|---|
| CN | 206711922 U | 12/2017 |
| CN | 107705710 A | 2/2018 |
| CN | 107742476 A | 2/2018 |
| CN | 107768547 A | 3/2018 |
| CN | 107787260 A | 3/2018 |
| CN | 107863357 A | 3/2018 |
| CN | 107910296 A | 4/2018 |
| CN | 108766242 A | 11/2018 |

\* cited by examiner

DISPLAY PANEL AND A MANUFACTURING METHOD THEREOF, AND DISPLAY DEVICE

CROSS-REFERENCE TO RELATED APPLICATION

This application is the U.S. national phase of PCT Application No. PCT/CN2019/077310 filed on Mar. 7, 2019, which claims priority to Chinese Patent Application No. 201810552167.7 filed on May 31, 2018, the disclosures of which are incorporated in their entirety by reference herein.

TECHNICAL FIELD

The present disclosure relates to the field of display technology, and in particular to a display panel and a manufacturing method thereof, and a display device.

BACKGROUND

With the rapid development of display screens, a variety of display technologies have appeared on the market, and display panels made by Organic Light-Emitting Display (OLED) technology have become the mainstream development direction in the display technology field due to the advantages of self-luminescence, high brightness, high image quality and power saving, and thus major manufacturers have invested heavily in such display panels. However, more problems arise in the production of such display panels, particularly flexible OLED display panels.

SUMMARY

An object of the present disclosure is to provide a display panel, a manufacturing method thereof and a display device.

The technical solutions provided by the present disclosure are as follows:

In a first aspect, the present disclosure provides a display panel including a display area and a peripheral area located in a periphery of the display area; wherein a stress absorption structure is provided in the peripheral area of the display panel.

Further, the stress absorption structure including a plurality of via holes arranged around the display area.

Further, the plurality of via holes are arranged in at least one circle and spaced apart from each other.

Further, the plurality of via holes are arranged in at least two circles, and the via holes in two adjacent circles are arranged alternately.

Further, at least some of the plurality of via holes have an elliptical shape or a circular shape.

Further, at least some of the plurality of via holes have a rhombus shape.

Further, the display panel has a rectangular shape, each circle of via holes form a rectangular ring matching the rectangular shape and include a plurality of first via holes located at four sides of the rectangular ring, the first via holes have a length greater than or equal to a width of the first via holes, an extending direction of the length of the first via holes coincides with a circumferential direction of the rectangular ring, and an extending direction of the width of the first via holes is perpendicular to the extending direction of the length.

Further, at least one circle of via holes further includes four second via holes located at four corners of the rectangular ring, and the second via holes are arc-shaped transitional via holes having round chamfers.

Further, the plurality of via holes are arranged in two circles, and the first via holes in each circle of via holes have an elliptical shape or a circular shape.

Further, the plurality of via holes are arranged in at least three circles, the first via holes in each circle of via holes have a rhombus shape, wherein the rhombus shape includes two first sides arranged in parallel and two second sides arranged in parallel, an angle between a first side and a second side has a round chamfer; the first sides of the rhombus shape of the first via holes in the circles of via holes are parallel with each other, and the second sides of the rhombus shape of the first via holes in the circles of via holes are parallel with each other.

Further, the flexible layer to be cut includes at least:
a flexible substrate layer formed on the rigid base substrate;
a buffer layer covering the flexible substrate layer; and
an interlayer dielectric layer covering the buffer layer;
wherein at least part of each of the flexible substrate layer, the buffer layer and the interlayer dielectric layer covers on the peripheral area of the display panel, and the via holes penetrate through at least one of the flexible substrate layer, the buffer layer and the interlayer dielectric layer.

In a second aspect, the present disclosure further provides a display device including the above display panel.

In a third aspect, the present disclosure further provides a manufacturing method of a display panel for manufacturing the above display panel. The method includes:
providing a rigid base substrate;
forming on the rigid base substrate a flexible layer to be cut which includes a plurality of display panels;
cutting the flexible layer to be cut along cutting lines to obtain a plurality of display panels separated from each other.

Further, the step of forming on the rigid base substrate the flexible layer to be cut includes:
forming a flexible substrate layer on the rigid base substrate, and forming a plurality of via holes in the flexible substrate layer at positions corresponding to the peripheral areas of the display panels by etching;
forming the buffer layer on the flexible substrate layer, and forming a plurality of via holes in the buffer layer at positions corresponding to the peripheral areas of the display panels by etching;
forming an interlayer dielectric layer on the buffer layer, and forming, in the interlayer dielectric layer, patterns of the display areas and a plurality of via holes in the peripheral areas of the display panels by a single patterning process.

DETAILED DESCRIPTION

The technical solutions of the embodiments of the present disclosure will be clearly and thoroughly described below in conjunction with the drawings of the embodiments of the present disclosure in order to make the objects, the technical solutions and the advantages of the embodiments of the present disclosure clearer. It is apparent that the described embodiments are some of the embodiments of the present disclosure, and not all of the embodiments. All other embodiments obtained by those of ordinary skill in the art based on the described embodiments of the present disclosure are within the protective scope of the present disclosure.

During manufacturing a flexible OLED display panel, a motherboard of the flexible OLED display panel is generally manufactured first. The motherboard is formed when the rigid base substrate is flexibly packaged. Then, the motherboard is cut to obtain separated OLED screens. When performing cutting, the rigid base substrate is removed and only the entire large flexible package is cut. During cutting, the stress on the screen edge of a separated OLED screen may be transmitted to the center of the screen due to thermal stress, increasing the stress in the display area in the center of the screen, and thus increasing the possibility of screen failure. Moreover, cracks may also occur at the screen edge, and the crack may expand from the screen edge to the display area in the center under the force, resulting in screen failure.

In view of the problems existing in the related art during the manufacturing process of the flexible display screen, e.g. the cutting stress or crack at the edge of the flexible display screen is transmitted and extended to the display area in the center of the screen to cause the screen to fail, some embodiments of the present disclosure provide a display panel and a manufacturing method thereof and a display device which can prevent the transfer and expansion of the cutting stress or crack at the screen edge to the display area in the center of the screen, thereby solving the problem of display screen failure thus caused.

Figure 1:
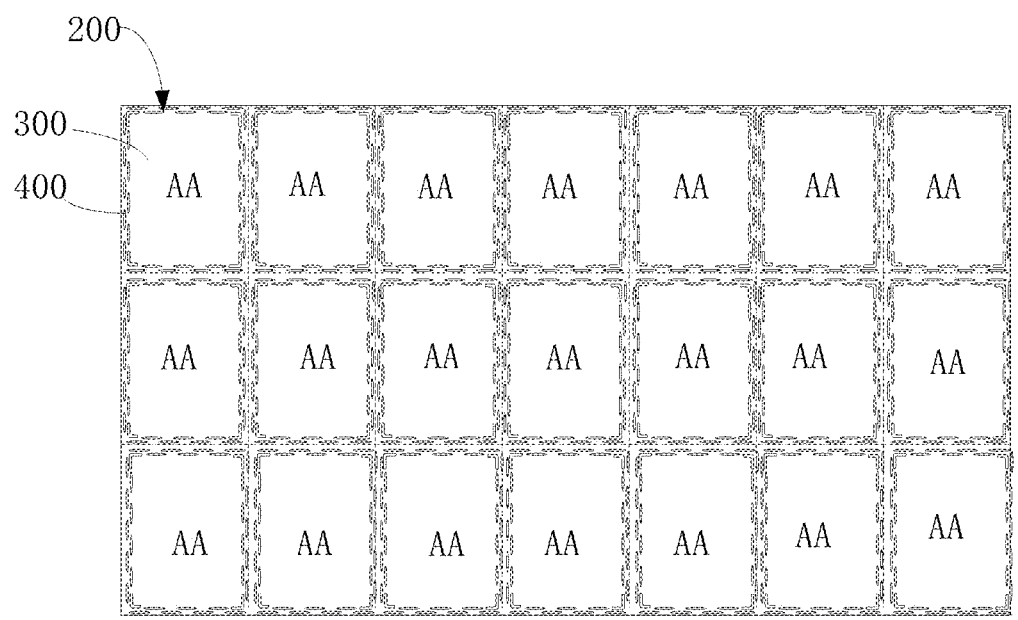
FIG. 1 shows a front view of a display substrate motherboard for preparing a display panel, provided by the present disclosure.

A display panel 300 provided by some embodiments of the present disclosure includes a display area (an AA region) and a peripheral region located in the periphery of the display area, wherein a stress absorption structure 400 is provided in the peripheral area of the display panel 300. In order to manufacture the display panel 300, a motherboard of a display substrate including a plurality of display panel units are formed first during the manufacturing process, and then the motherboard of the display substrate is cut to obtain display panels 300 separated from each other. FIG. 1 shows the above motherboard of the display substrate for manufacturing the display panels 300.

In the above solution, the motherboard of the display substrate is formed by making a flexibly package on a rigid base substrate 100 during the manufacturing process of the flexible display screen, and includes the rigid base substrate 100 and a flexible layer 200 to be cut. Taking a case that the motherboard of the display substrate is a motherboard of an OLED display screen as an example, the flexible layer 200 to be cut may include a flexible substrate layer, a buffer layer, an interlayer dielectric layer, and an OLED structure consisting of an anode layer, a cathode layer and an organic light emitting layer, etc.; when cutting the motherboard, the rigid base substrate 100 may be removed, and the flexible layer 200 to be cut is cut. After cutting the flexible layer 200 to be cut, separated display panels (individual screens) 300 are formed. In the above solution, by providing the stress absorption structure 400 at positions on the flexible layer 200 to be cut on the motherboard of the display substrate corresponding to the peripheral area of each display panel 300, when cutting the flexible layer 200 to be cut, the cutting stress or crack at the screen edges (i.e., the cutting lines) of the display panels 300 may encounter the stress absorption structure 400 while being transmitted and extended to the display areas in the centers of the screens, and the stress absorption structure 400 can prevent the transfer and expansion of the stress and crack to the display areas in the centers of the screens, thereby effectively solving the problem of display screen failure during the manufacturing process of the display panels.

It should be noted that, the display panel may also be a display panel other than the OLED display panel. For example, the display panel may also be an AMOLED (Active-Matrix Organic Light Emitting Diode) display panel, a QLED (Quantum Dot Light Emitting Diodes) display panel, or an AMQLED (Active-Matrix Quantum Dot Light Emitting Diodes) display panel, and so on.

Furthermore, the stress absorption structure 400 is a structure which can prevent the transfer and expansion of the cutting stress and crack at the screen edges to the display areas in the centers of the screens, and can be implemented in various manners as long as it has the capability of preventing the transfer and expansion of the cutting stress and crack at the screen edges. An exemplary implementation of the stress absorption structure 400 is described below.

In an exemplary embodiment provided by the present disclosure, the stress absorption structure 400 includes a plurality of via holes distributed in the peripheral area.

In the above solution, at least one layer of flexible film (e.g., a flexible substrate layer) is provided in the peripheral area of the display panel 300. The stress absorption structure 400 is implemented by the via holes, and the via holes is provided to penetrate through the flexible films in the peripheral area. As such, when cutting the flexible layer 200 to be cut, the cutting stress or crack at the screen edges (i.e., the cutting lines) of the display panel 300 may certainly encounter the via holes in the peripheral area of the display panel 300 while being transmitted and extended to the display area in the center of the screen, and is prevented by the via holes from being transmitted and extended to the display area in the center of the screen, which thereby effectively solves the problem of display screen failure caused during cutting. The stress absorption structure 400 implemented by via holes has advantages of simple structure, simple manufacturing process, and the like.

It will be appreciated that, in practical applications, the specific implementations of the stress absorption structure 400 are not limited to the above. For example, there may be at least two layers of flexible films in the peripheral area of the display panel 300, and the stress absorption structure 400 may be via holes provided in only one or some of the flexible films. That is to say, the stress absorption structure 400 may be a groove-like structure in the peripheral area of the display panel 300, instead of penetrates through all the flexible films in the thickness direction.

Similarly, in some embodiments of the present disclosure, the above plurality of via holes may have different depths. For example, via holes penetrating through all the flexible films are provided in a portion of the area, while via holes penetrating through only some of the flexible films are provided in the other portion of the area.

Furthermore, it should be noted that, in the above solution, as shown in FIG. 1, optionally, a cutting area is formed between two adjacent display panel 300, and the via holes should have a predetermined distance from the cutting lines (i.e., the edges of the screen) of the display panel 300, so as to ensure that the via holes will not be cut during the cutting process. The specific value of the predetermined distance may be designed according to the specific size of the display screen, which is not limited thereto.

Several embodiments of the display panel provided by the present disclosure are described below.

It should be noted that, the same components are marked with different reference numerals in different embodiments only for convenience of description, and have no other limited meaning.

Figure 2:
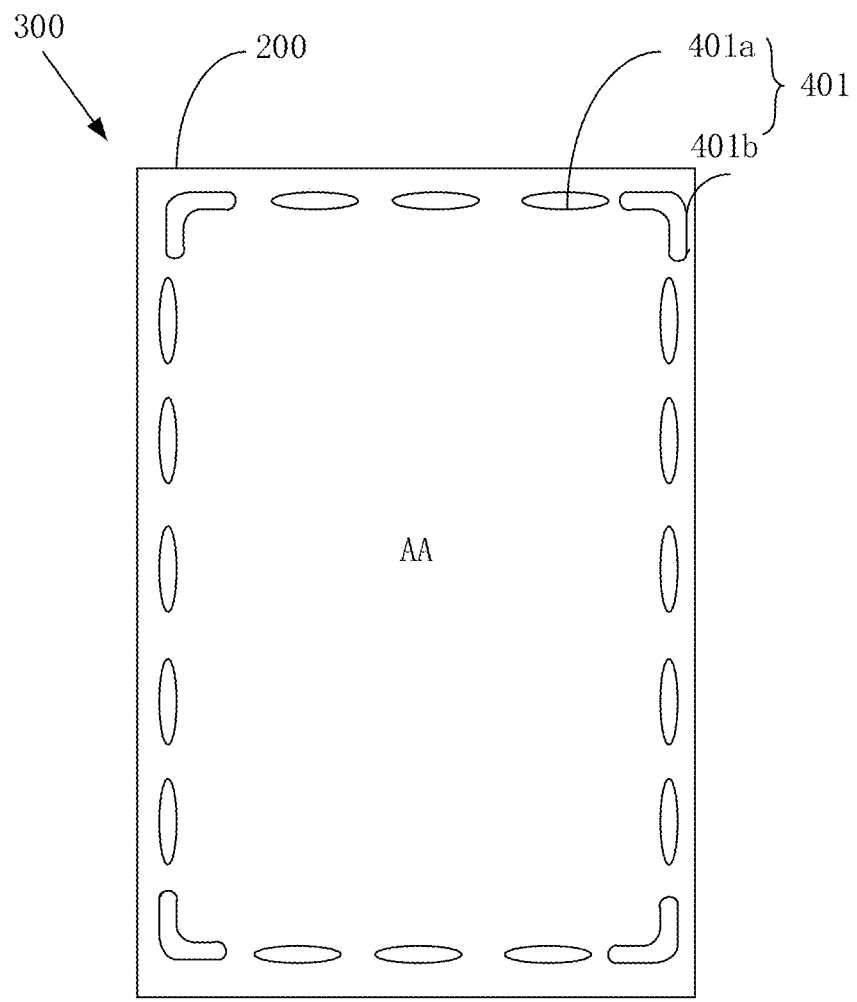
FIG. 2 shows a structural diagram of a display panel provided by some embodiments of the present disclosure.

FIG. 2 shows a structural diagram of a display panel provided by some embodiments of the present disclosure.

As shown in FIG. 2, in this embodiment, the stress absorption structure 400 includes a plurality of via holes 401 distributed in the peripheral area, and are arranged around the display area as a circle and spaced apart from each other.

According to the above solution, the plurality of via holes 401 are arranged in a circle in the peripheral area of the display panel 300 and spaced apart from each other. Since the plurality of via holes 401 are arranged in a circle around the display area, the cutting stress or crack in the circumferential direction of the display panel 300 when being cut may be prevented by the via holes 401 from being transmitted and extended to the display area.

Obviously, it will be appreciated that, in practical applications, the arrangement of the via holes 401 is not limited thereto, and may not be arranged as a circle as long as the via holes 401 are distributed at various positions in the circumferential direction in the peripheral area of the display panel 300.

In addition, in the present embodiment, as shown in FIG. 2, the display panel 300 has a rectangular shape, the circle of via holes form a rectangular ring matching the rectangular shape and include a plurality of first via holes 401a located at four sides of the rectangular ring. The first via holes 401a have a length greater than or equal to a width of the first via holes 401a, an extending direction of the length of the first via holes 401a coincides with a circumferential direction of the rectangular ring, and an extending direction of the width of the first via holes 401a is perpendicular to the extending direction of the length.

According to the above solution, in one circle of via holes, a plurality of first via holes 401a are provided at positions corresponding to the four sides of the display panel 300, and when each first via 401a has a length L greater than a width D of the first via 401a, the first via 401a has substantially a shape of a strip. On one hand, since the stress transfer direction is substantially vertical to the circumferential direction (i.e., the length direction of the first via 401a) of the circle of via holes when the cutting stress or crack at the screen edges of the display panel 300 is transmitted and expanded to the display area, a strip-shaped first via 401a can absorb the stress better; on the other hand, since the width of the peripheral area of the display panel 300 is limited, the first via 401a designed to have a strip shape is more advantageous for spatial layout. In practical applications, considering the formation of via holes leads to additional processes and costs, providing the via holes in the peripheral area of the display panel helps to achieve a practically acceptable effect of blocking the stress or crack at relatively low cost and process burden, so as to eliminate or greatly reduce the problem of display screen failure caused by the transfer and expansion of the cutting stress or crack from the screen edges to the display area in the center of the screen.

It should be noted that, in the above solution, the first via 401a has a shape of a strip; however, it may have any other shape such as an elliptical shape, a rectangular shape, a rhombus shape, a triangular shape or a trapezoidal shape and so on, as long as the length of the first via holes 401a is greater than the width thereof.

In another embodiment, the length L of the first via 401a may be equal to the width D, and its shape is not limited thereto. For example, its shape may be a circle, a square, etc.

It should be noted that, the shape of the first via 401a may be a shape with a smooth curve such as an ellipse or a circle so that stress concentration and the like are not caused.

Obviously, it will be appreciated that, when the first via 401a has a shape with an interior angle(s) other than a circular shape or an elliptical shape, in order to avoid the problem of stress concentration, the interior angle(s) of the first via 401a may be rounded. For example, when the first via 401a has a rhombus shape, the interior corners of the rhombus shape may be rounded.

Furthermore, as shown in FIG. 2, in the present embodiment, one circle of via holes further exemplarily include four second via holes 401b located at four corners of the rectangular ring, and the second via holes 401b are arc-shaped transitional via holes having round chamfers.

If two via holes 401 spaced apart from each other are provided at a corner of the display panel 300, a gap existing between the two via holes 401 may cause the cutting stress or crack at the corner of the display panel 300 to be transmitted to the display area. However, according to the above solution, the circle of via holes include an arc-shaped transitional via at each corner of the display panel 300, thereby ensuring that the cutting stress or crack at the corners of the display panel 300 will not be transmitted to the display area.

Figure 3:
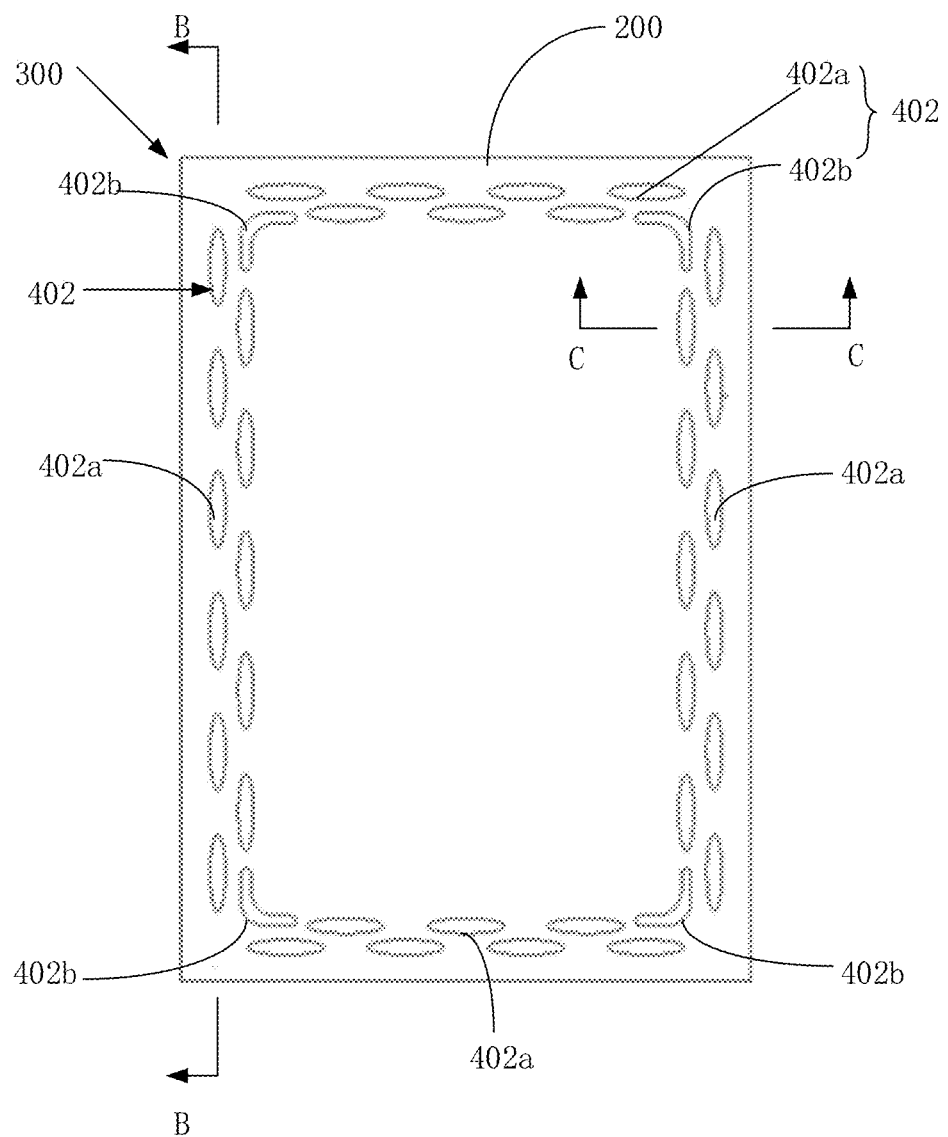
FIG. 3 shows a structural diagram of a display panel provided by some embodiments of the present disclosure.

FIG. 3 shows a structural diagram of a display panel provided by some embodiments of the present disclosure.

As shown in FIG. 3, in the present embodiment, the stress absorption structure 400 includes a plurality of via holes 402 distributed in the peripheral area. The plurality of via holes are arranged in two circles. The two circles of via holes are arranged in order, from inside to outside, from a side close to the display area to a side away from the display area. The via holes 402 in each circle of via holes are spaced apart, and the via holes 402 in two adjacent circle of via holes are arranged alternately.

In the above solution, if only one circle of via holes is provided, a gap may exist between adjacent via holes 401; thus, the cutting stress or crack at the screen edges cannot be effectively prevented from being transmitted and extended to the display area. Therefore, according to above solution, a plurality of via holes 402 are arranged in an inner circle and an outer circle from inside to outside in the peripheral area, and the via holes 402 in the inner circle and the via holes 402 in the outer circle are arranged alternately. In this way, before cutting the flexible layer 200 to be cut, no problem will occur during transporting since there is the rigid base substrate 100; when cutting the flexible layer 200 to be cut after the rigid base substrate 100 is removed, the cutting stress or crack at the screen edges may certainly encounter the via holes 402 while being transmitted and extended to the display areas, so as to effectively prevent the transfer and expansion of the stress and crack to the display areas. Furthermore, optionally, when seen from the screen edges surrounding the display panel 300, at least some via holes in the two circles of via holes should be arranged alternately, in other words, the positions of the via holes on the outside correspond to the positions of the intervals between the via holes on the inside, so that the stress and crack may certainly encounter at least one via while being transmitted and extended from the screen edges to the display areas, and thereby the stress absorption effect can be more effectively ensured.

In addition, in the present embodiment, as shown in FIG. 3, the display panel 300 has a rectangular shape, the at least one circle of via holes 402 form a rectangular ring matching the rectangular shape, and each circle of via holes include a plurality of first via holes 402a located at four sides of the rectangular ring. The first via holes 402a have a length greater than or equal to a width of the first via holes 402a, an extending direction of the length of the first via holes 402a coincides with a circumferential direction of the rectangular ring, and an extending direction of the width of the first via holes 402a is perpendicular to the extending direction of the length.

According to the above solution, in each circle of via holes, when the first via holes 402a located at positions corresponding to the four sides of the display panel 300 have a length L greater than a width D of the first via holes 402a, the first via holes 402a have substantially a shape of a strip. On one hand, since the stress transfer direction is substantially vertical to the circumferential direction (i.e., the length direction of the first via 402a) of each circle of via holes when the cutting stress or crack at the screen edges of the display panel 300 is transmitted and expanded to the display area, a strip-shaped first via 402a can absorb the stress better; on the other hand, since the width of the peripheral area of the display panel 300 is limited, the first via 402a designed to have a strip shape is more advantageous for spatial layout.

It should be noted that, in the above solution, the first via 402a has a shape of a strip; it may have any other shape such as an elliptical shape, a rectangular shape, a rhombus shape, a triangular shape or a trapezoidal shape and so on, as long as the length of the first via holes 402a is greater than the width thereof. In other embodiments, the length L of the first via 402a may be equal to the width D, and its shape is not limited thereto. For example, its shape may be a circle, a square, etc.

In the present embodiment, optionally, the shape of the first via 402a is a shape with a smooth curve such as an ellipse or a circle so that stress concentration and the like are not caused.

Obviously, it will be appreciated that, when the first via 402a has a shape with an interior angle(s) other than a circular shape or an elliptical shape, in order to avoid the problem of stress concentration, the interior angle(s) of the first via 402a may be rounded. For example, when the first via 402a has a rhombus shape, the interior corners of the rhombus shape may be rounded.

Furthermore, as shown in FIG. 3, it should be noted that, in the present embodiment, at least one circle of via holes further include second via holes 402b located at four corners of the rectangular ring, and the second via holes 402b are arc-shaped transitional via holes having round chamfers.

If two via holes 402 spaced apart from each other are provided at a corner of the display panel 300, a gap existing between the two via holes 402 may cause the cutting stress or crack at the corner of the display panel 300 to be transmitted to the display area. However, according to the above solution, at least one circle of via holes include an arc-shaped transitional via at each corner of the display panel 300, thereby ensuring that the cutting stress or crack at the corners of the display panel 300 will not be transmitted to the display area.

Optionally, in the present embodiment, as shown in FIG. 3, the arc-shaped transitional via holes are included in the inner circle of via holes, thereby facilitating the spatial layout. In practical applications, the arc-shaped transitional via holes may be included in the outer circle of via holes, or both the inner circle of via holes and the outer circle of via holes include the arc-shaped transitional via holes.

Figure 6:
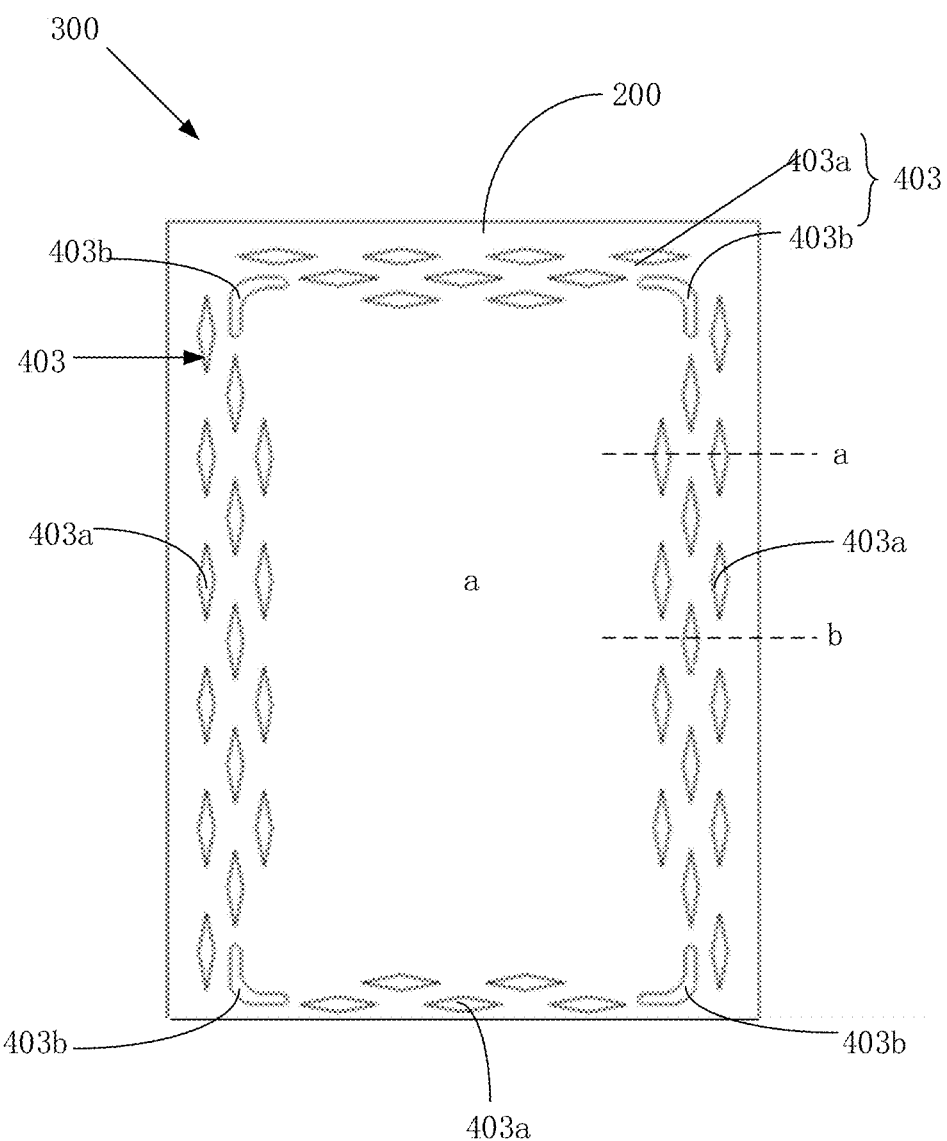
FIG. 6 shows a structural diagram of a display panel provided by some embodiments of the present disclosure.

FIG. 6 shows a structural diagram of a display panel provided by some embodiments of the present disclosure. As shown in FIG. 6, in the present embodiment, the stress absorption structure 400 includes a plurality of via holes 403 distributed in the peripheral area. The plurality of via holes 403 are arranged in at least three circles (illustrated by three circles of via holes in the figure). The at least three circles of via holes 403 are arranged in order, from inside to outside, from a side close to the display area to a side away from the display area. The via holes 403 in each circle of via holes are spaced apart, and the via holes 403 in two adjacent circle of via holes are arranged alternately.

In the above solutions, if only one circle of via holes is provided, a gap may exist between adjacent via holes 401, thus the cutting stress or crack at the screen edges cannot be effectively prevented from being transmitted and extended to the display area from the gap. Therefore, according to above solution, a plurality of via holes 403 are arranged in an inner circle, an intermediate circle and an outer circle from inside to outside in the peripheral area, and the via holes 403 in two adjacent circles are arranged alternately. In this way, before cutting the flexible layer 200 to be cut, no problem will occur during transporting since there is the rigid base substrate 100; when cutting the flexible layer 200 to be cut after the rigid base substrate 100 is removed, the cutting stress or crack at the screen edges may certainly encounter the via holes 403 while being transmitted and extended to the display areas, so as to effectively prevent the transfer and expansion of the stress and crack to the display areas. Furthermore, optionally, when seen from the screen edges surrounding the display panel 300, at least some via holes in any two adjacent circles should be arranged alternately, in other words, the positions of the outer via holes correspond to the positions of the intervals between the inner via holes, so that the stress and crack may certainly encounter at least one via while being transmitted and extended from the screen edges to the display areas, and thereby the stress absorption effect can be more effectively ensured.

In addition, in the present embodiment, as shown in FIG. 6, the display panel 300 has a rectangular shape, the at least one circle of via holes 403 form a rectangular ring matching the rectangular shape, and each circle of via holes include a plurality of first via holes 403a located at four sides of the rectangular ring. The first via holes 403a have a length greater than or equal to a width of the first via holes 403a, an extending direction of the length of the first via holes 403a coincides with a circumferential direction of the rectangular ring, and an extending direction of the width of the first via holes 403a is perpendicular to the extending direction of the length.

According to the above solution, in each circle of via holes, when the first via holes 403a located at positions corresponding to the four sides of the display panel 300 have a length L greater than a width D of the first via holes 403a, the first via holes 403a have substantially an elongated shape. On one hand, since the stress transfer direction is substantially vertical to the circumferential direction (i.e., the length direction of the first via 403*a*) of each circle of via holes when the cutting stress or crack at the screen edges of the display panel 300 is transmitted and expanded to the display area, a first via 403*a* having an elongated shape can absorb the stress better; on the other hand, since the width of the peripheral area of the display panel 300 is limited, the first via 403*a* designed to have an elongated shape is more advantageous for spatial layout.

It should be noted that, in the above solution, the first via 403*a* has an elongated shape; it may have any other shape such as an elliptical shape, a rectangular shape, a rhombus shape, a triangular shape or a trapezoidal shape and so on, as long as the length of the first via holes 403*a* is greater than the width thereof.

In the present embodiment, optionally, as shown in FIG. 6, the first via holes 403*a* in each circle of via holes have a rhombus shape which includes two first sides arranged in parallel and two second sides arranged in parallel, an angle between a first side and a second side having a round chamfer; the first sides of the rhombus shape of the first via holes 403*a* in the circles of via holes are parallel with each other, and the second sides of the rhombus shape of the first via holes 403*a* in the circles of via holes are parallel with each other.

In the present embodiment, in the peripheral area of each display panel 300, there are at least three circles of via holes: the inner via holes, the intermediate via holes 403 and the outer via holes. The at least three circles of via holes at the screen edges are designed in such a manner that the first via holes 403*a* in each circle of via holes have a rhombus shape, and the interior angles of the rhombus shape are chamfered to avoid sharp corners. Thus, in view of the limited space in the peripheral area of the screen, at least three circles of via holes are provided in the peripheral area, the first via holes 403*a* in each circle of via holes are designed as a rhombus shape, and the first via holes 403*a* in different circles of via holes are alternately arranged; such a design is more advantageous for spatial layout, compared with a design in which the first via holes 403*a* have other shapes such as an elliptical shape.

In the present embodiment, optionally, the first via holes 403*a* in each circle of via holes have the same shape and the same size; a line a, which connects the center of the rhombus shape of any one of the first via holes 403*a* in the inner circle with the center of the rhombus shape of a first via 403*a* in the outer circle that is facing the one first via 403*a*, is perpendicular to the edge line of the screen (i.e., the edge cutting line of the display panel 300); a line b, which connects the center of the rhombus shape of any one of the first via holes 403*a* in the intermediate circle with the center of the gap between two first via holes 403*a* in the inner circle that are adjacent to the one first via 403*a*, is perpendicular to the edge line of the screen (i.e., the edge cutting line of the display panel 300); and a line c, which connects the center of the rhombus shape of any one of the first via holes 403*a* in the intermediate circle with the center of the gap between two first via holes 403*a* in the outer circle that are adjacent to the one first via 403*a*, is perpendicular to the edge line of the screen (i.e., the edge cutting line of the display panel 300). The line b coincides with the line c.

Obviously, it will be appreciated that, in other embodiments, the first via 403*a* may have a length L equal to a width D thereof, and its shape is also not limited. For example, its shape may be a circle, a square, etc. When the first via 403*a* has a shape with an interior angle(s) other than a circular shape or an elliptical shape, in order to avoid the problem of stress concentration, the interior angle(s) of the first via 403*a* may be rounded.

Furthermore, as shown in FIG. 6, in the present embodiment, at least one circle of via holes further include second via holes 403*b* located at four corners of the rectangular ring, and the second via holes 403*b* are arc-shaped transitional via holes having round chamfers.

If two via holes 403 spaced apart from each other are provided at a corner of the display panel 300, the gap existing between the two via holes 403 may cause the cutting stress or crack at the corner of the display panel 300 to be transmitted to the display area. However, according to the above solution, at least one circle of via holes include an arc-shaped transitional via at each corner of the display panel 300, thereby ensuring that the cutting stress or crack at the corners of the display panel 300 will not be transmitted to the display area.

Optionally, in the present embodiment, as shown in FIG. 6, the intermediate circle of via holes may include the second via 403*b* provided at each corner, which is an arc-shaped transitional via.

According to the above solution, the arc-shaped transitional via holes are provided in the intermediate circle of via holes so as to facilitate the spatial layout. In practical applications, the arc-shaped transitional via holes may be provided in the inner circle of via holes and/or both the outer circle of via holes. It should be noted that the above three embodiments are provided merely to exemplarily describe the display panels of the embodiments of the present disclosure, and the embodiments are not limited thereto.

Furthermore, it should also be noted that in a motherboard of a display substrate provided by some embodiments of the present disclosure, the motherboard of the display substrate is formed by making a flexibly package on a rigid base substrate 100 during the manufacturing process of the flexible display screen, and includes the rigid base substrate 100 and a flexible layer 200 to be cut.

Figure 4:
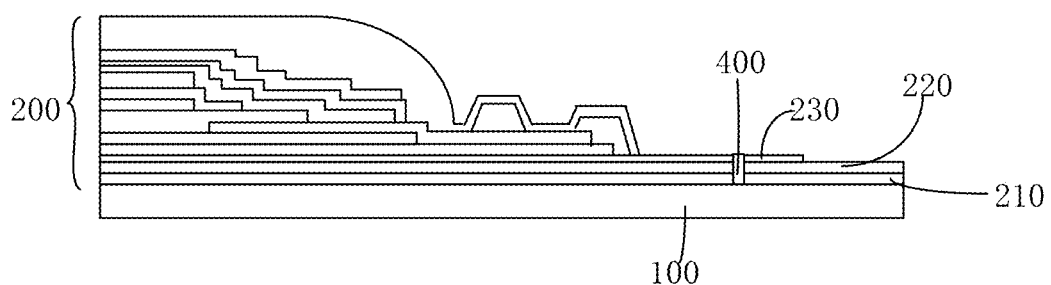
FIG. 4 shows a cross-sectional view taken along a line C-C in FIG. 3.
Figure 5:
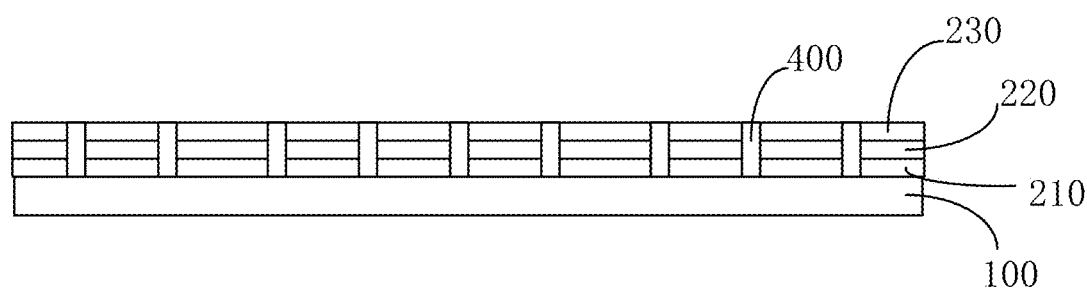
FIG. 5 shows a cross-sectional view taken along a line B-B in FIG. 3.

Taking a case that the motherboard of the display substrate is a motherboard of an OLED display screen as an example, as shown in FIGS. 4 and 5, the flexible layer 200 to be cut may include at least:

a flexible substrate layer 210 formed on the rigid base substrate 100;

a buffer layer 220 covering the flexible substrate layer 210; and an interlayer dielectric layer 230 covering the buffer layer 220;

wherein at least part of each of the flexible substrate layer 210, the buffer layer 220 and the interlayer dielectric layer 230 covers on the peripheral area of the display panel 300, and the via holes 401 are provided to penetrate through the flexible substrate layer 210, the buffer layer 220 and the interlayer dielectric layer 230.

As for the above solution, an OLED display screen is taken as an example, in which the flexible substrate layer 210, the buffer layer 220 and the interlayer dielectric layer 230 are generally formed in the peripheral area thereof. Accordingly, the via holes 401 exemplarily penetrate through the flexible substrate layer 210, the buffer layer 220 and the interlayer dielectric layer 230. Obviously, the above is merely an example. In practical applications, the specific structure of the films in the peripheral area of the display panel 300 may not be limited thereto.

It should also be noted that, the structure of the flexible layer 200 to be cut is described above merely with reference to the configuration of the motherboard of the display substrate illustrated in FIGS. 4 and 5. It will be appreciated that the structure of the above flexible layer 200 to be cut may also be applied to other modified embodiments.

In the above implementations, a stress absorption structure is provided in the peripheral area of each display panel; thus, when cutting the flexible layer to be cut, the cutting stress or crack at the screen edges (i.e., the cutting lines) of the display panels may encounter the stress absorption structure while being transmitted and extended to the display areas in the centers of the screens from the screen edges, and the stress absorption structure can prevent the transfer and expansion of the cutting stress and crack at the screen edges to the display areas in the centers of the screens, thereby effectively solving the problem of display screen failure during the manufacturing process of the display panels.

Furthermore, in a second aspect, the present disclosure further provides a display device which includes the display panel 300 provided by the above embodiments of the present disclosure.

Obviously, according to the embodiments of the present disclosure, display panels 300 separated from each other are obtained after the flexible layer 200 to be cut provided by the embodiments of the present disclosure is cut. Each of the display panel 300 has the stress absorption structure 400 provided in the peripheral area, the specific structure of the stress absorption structure 400 has been described above and is not repeated here. Since the display device provided by the present disclosure includes the above display panel 300, it does not suffer from the problem of screen failure caused by the cutting stress and cracks during the manufacturing process.

Figure 7:
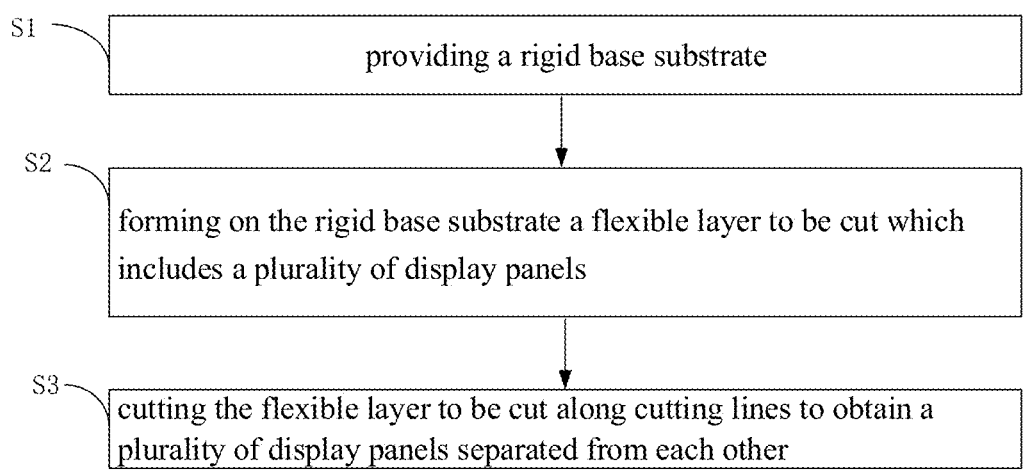
FIG. 7 shows a flowchart of a manufacturing method of a display panel provided by some embodiments of the present disclosure.

Furthermore, the embodiments of the present disclosure further provide a manufacturing method of a display panel for manufacturing the display panel provided by the embodiments of the present disclosure. As shown in FIG. 7, the method includes:

Step S1, providing a rigid base substrate 100;

Step S2, forming on the rigid base substrate 100 a flexible layer 200 to be cut which includes a plurality of display panels 300; and Step S3, cutting the flexible layer 200 to be cut along the cutting lines to obtain a plurality of display panels separated from each other.

In the above solution, the motherboard of the display substrate is formed by making a flexibly package on a rigid base substrate 100 during the manufacturing process of the flexible display screen, and includes the rigid base substrate 100 and a flexible layer 200 to be cut. Taking a case that the motherboard of the display substrate is a motherboard of an OLED display screen as an example, the flexible layer 200 to be cut may include a flexible substrate layer 210, a buffer layer 220, an interlayer dielectric layer 230, and an OLED structure consisting of an anode layer, a cathode layer and an organic light emitting layer, etc.; when cutting the motherboard, the rigid base substrate 100 may be removed, and the flexible layer 200 to be cut is cut. After cutting the flexible layer 200 to be cut, separated display panels (individual screens) 300 are formed. In the above solution, by providing the stress absorption structure 400 at positions on the flexible layer 200 to be cut on the motherboard of the display substrate corresponding to the peripheral area of each display panel 300, when cutting the flexible layer 200 to be cut, the cutting stress or crack at the screen edges (i.e., the cutting lines) of the display panels 300 may encounter the stress absorption structure 400 while being transmitted and extended to the display areas in the centers of the screens, and the stress absorption structure 400 can prevent the transfer and expansion of the stress and crack to the display areas in the centers of the screens, thereby effectively solving the problem of display screen failure during the manufacturing process of the display panels.

It should be noted that, the display panel may also be a display panel other than the OLED display panel. For example, the display panel may also be an AMOLED (Active-Matrix Organic Light Emitting Diode) display panel, a QLED (Quantum Dot Light Emitting Diodes) display panel, or an AMQLED (Active-Matrix Quantum Dot Light Emitting Diodes) display panel, and so on.

In some embodiments of the present disclosure, in the above step S2 of the method, the flexible layer 200 to be cut is formed on the rigid base substrate 100, and the flexible layer 200 to be cut includes various types of films, and the films may be fabricated by using a manufacturing process in the prior art. The difference from the prior art is that, it is required to form via holes 401 in the films to be cut in the peripheral area of each display panel 300; specifically, when forming the via holes in the peripheral area of each display panel 300, they may be formed by a patterning process including an etching process. Taking a case that the films to be cut include the flexible substrate layer 210, the buffer layer 220, and the interlayer dielectric layer 230 as an example, the above step S2 specifically includes:

Step S21, forming the flexible substrate layer 210 on the rigid base substrate 100, and forming a plurality of via holes 401 in the flexible substrate layer 210 at positions corresponding to the peripheral areas of the display panels 300 by etching;

Step S22, forming the buffer layer 220 on the flexible substrate layer 210, and forming a plurality of via holes 401 in the buffer layer 220 at positions corresponding to the peripheral areas of the display panels 300 by etching;

Step S23, forming the interlayer dielectric layer 230 on the buffer layer 220, and forming, in the interlayer dielectric layer 230, patterns of the display areas and a plurality of via holes 401 in the peripheral areas of the display panels 300 by a single patterning process.

According to the above solution, taking a case that the peripheral areas of the display panels 300 include therein the flexible substrate layer 210, the buffer layer 220 and the interlayer dielectric layer 230 as an example, when manufacturing the display panels, firstly, the flexible substrate layer 210 is formed on the rigid base substrate 100, wherein a plurality of via holes 401 may be formed in the peripheral area of the flexible substrate layer 210 by the etching process which may specifically include processes such as photoresist coating, exposure, development, etching, and the like; secondly, the buffer layer 220 is formed on the flexible substrate layer 210, and a plurality of via holes 401 may be formed in the peripheral area of the buffer layer 220 by the etching process, wherein the via holes 410 in the buffer layer 220 are aligned with the via holes 401 in the flexible substrate layer 210, and specifically, the etching process may include processes such as photoresist coating, exposure, development, etching, and the like; then, the interlayer dielectric layer 230 is formed on the buffer layer 220; in a case that the interlayer dielectric layer 230 has patterns in the display area, the patterns of the interlayer dielectric layer 230 in the display area are formed by the etching process; specifically, the etching process may include processes such as photoresist coating, exposure, development, etching, and the like; wherein, in order to form via holes 401 in the interlayer dielectric layer 230 at positions corresponding to the peripheral area, designed patterns of via holes 401 may be formed on a mask for exposure when the mask is fabricated, so that forming the patterns of the display areas of the display panels 300 in the interlayer dielectric layer 230 and forming the plurality of via holes 401 of the peripheral areas of the display panels 300 in the interlayer dielectric layer 230 can be performed simultaneously in a single patterning process without adding new process step(s).

It should be noted that, in the above solution, the specific structure of the films of the flexible layer 200 to be cut is not limited. The above description is merely illustrative. As for a certain film included in the flexible layer 200 to be cut located in the peripheral areas of the display panels 300, the via holes 401 may be formed in this film by the etching process. In a case that this film also has patterns in the display area, the original mask may be modified by adding the patterns of the via holes 401 to the original mask so as to achieve the purpose that the patterns of the display areas and the via holes 401 in the peripheral areas can be formed in a single patterning process. Thus, no new process step(s) are added, and the process is simplified.

The above only describes the preferred embodiments of the present disclosure. It should be noted that those skilled in the art can also make various improvements and substitutions without departing from the principles of the present disclosure, and such improvements and substitutions should also be considered as the protective scope of the present disclosure.

What is claimed is:

1. A display panel, comprising:
a display area; and
a peripheral area located in a periphery of the display area,
wherein a stress absorption structure is provided in the peripheral area of the display panel,
wherein the stress absorption structure comprises a plurality of via holes arranged around the display area, and
wherein the plurality of via holes are arranged in at least one circle and spaced apart from each other.

2. The display panel according to claim 1, wherein the plurality of via holes are arranged in at least two circles, and the via holes in two adjacent circles are arranged alternately.

3. The display panel according to claim 1, wherein at least some of the plurality of via holes each have an elliptical shape or a circular shape.

4. The display panel according to claim 1, wherein at least some of the plurality of via holes each have a rhombus shape.

5. The display panel according to claim 1, wherein the display panel has a rectangular shape, each circle of via holes form a rectangular ring matching the rectangular shape and comprise a plurality of first via holes located at four sides of the rectangular ring, the first via holes have a length greater than or equal to a width of the first via holes, an extending direction of the length of the first via holes coincides with a circumferential direction of the rectangular ring, and an extending direction of the width of the first via holes is perpendicular to the extending direction of the length.

6. The display panel according to claim 2, wherein the display panel has a rectangular shape, each circle of via holes form a rectangular ring matching the rectangular shape and comprise a plurality of first via holes located at four sides of the rectangular ring, wherein the first via holes in two adjacent circles are arranged alternately.

7. The display panel according to claim 6, wherein, the plurality of via holes are arranged in at least three circles, the first via holes in each circle of via holes have a rhombus shape, wherein the rhombus shape comprises two first sides arranged in parallel and two second sides arranged in parallel, an angle between a first side and a second side has a round chamfer; the first sides of the rhombus shapes of the first via holes in the circles of via holes are parallel with each other, and the second sides of the rhombus shapes of the first via holes in the circles of via holes are parallel with each other.

8. The display panel according to claim 7, wherein each circle of via holes further comprises four second via holes located at four corners of the rectangular ring, and the second via holes are arc-shaped transitional via holes having round chamfers.

9. The display panel according to claim 1, wherein the display panel is a flexible display panel.

10. A display device comprising the display panel according to claim 1.

11. A manufacturing method for manufacturing a display panel, comprising:
providing a rigid base substrate;
forming on the rigid base substrate a flexible layer to be cut which comprises a plurality of di splay panels;
cutting the flexible layer to be cut along cutting lines to obtain a plurality of display panels separated from each other,
wherein said forming on the rigid base substrate the flexible layer to be cut comprises:
forming a flexible substrate layer on the rigid base substrate, and forming a plurality of via holes in the flexible substrate layer at positions corresponding to the peripheral areas of the display panels by etching;
forming a buffer layer on the flexible substrate layer, and forming a plurality of via holes in the buffer layer at positions corresponding to the peripheral areas of the display panels by etching; and
forming an interlayer dielectric layer on the buffer layer, and forming, in the interlayer dielectric layer, patterns of the display areas and a plurality of via holes in the peripheral areas of the display panels by a single patterning process.

12. The display panel according to claim 2, wherein at least some of the plurality of via holes each have an elliptical shape or a circular shape.

13. The display panel according to claim 2, wherein at least some of the plurality of via holes each have a rhombus shape.

14. The display panel according to claim 8, wherein each circle of via holes further comprises four second via holes located at four corners of the rectangular ring, and the second via holes are arc-shaped transitional via holes having round chamfers.

15. The display panel according to claim 9, wherein each circle of via holes further comprises four second via holes located at four corners of the rectangular ring, and the second via holes are arc-shaped transitional via holes having round chamfers.

16. A display device comprising the display panel according to claim 1.

17. A display device comprising the display panel according to claim 1.

* * * * *